United States Patent
Baxter et al.

(10) Patent No.: US 6,953,958 B2
(45) Date of Patent: Oct. 11, 2005

(54) ELECTRONIC GAIN CELL BASED CHARGE SENSOR

(75) Inventors: Gregory T. Baxter, Salinas, CA (US); Sandip Tiwari, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 37 days.

(21) Appl. No.: 10/393,515

(22) Filed: Mar. 19, 2003

(65) Prior Publication Data

US 2003/0231531 A1 Dec. 18, 2003

Related U.S. Application Data

(60) Provisional application No. 60/365,606, filed on Mar. 19, 2002.

(51) Int. Cl.$^7$ .............................................. H01L 23/58
(52) U.S. Cl. ..................... 257/253; 257/252; 438/49
(58) Field of Search ................................ 257/252, 253, 257/410, 414; 438/49

(56) References Cited

U.S. PATENT DOCUMENTS

| | | | | |
|---|---|---|---|---|
| 4,411,741 A | * | 10/1983 | Janata | 257/253 |
| 4,514,263 A | * | 4/1985 | Janata | 205/782 |
| 4,671,852 A | * | 6/1987 | Pyke | 438/49 |
| 5,683,569 A | * | 11/1997 | Chung et al. | 205/775 |
| 5,747,839 A | * | 5/1998 | Hammond et al. | 257/253 |
| 5,892,252 A | * | 4/1999 | Hammond et al. | 257/252 |
| 6,248,626 B1 | | 6/2001 | Kumar et al. | 438/257 |
| 6,445,032 B1 | | 9/2002 | Kumar et al. | 257/321 |
| 6,753,200 B2 | * | 6/2004 | Craighead et al. | 438/48 |
| 2004/0248349 A1 | * | 12/2004 | Renna et al. | 438/197 |

OTHER PUBLICATIONS

Alper, J., "From the bioweapons trenches, new tools for battling microbes", *Science*, 2284 (5421), (Jun. 1999), 1754–1755.

De Gennes, Pierre–Gilles, "Passive Entry of a DNA Molecule into a Small Pore", *Proceedings of the National Academy of Sciences*, 96, (1999), 7262–7264.

Duke, T., et al., "Microfabricated sieve for the continuous sorting of macromolecules", *Physical Review Letters*, 80 (7), (1998), 1552–1555.

Kasianowicz, E., et al., "Characterization of Individual Polynucleotide Molecules Using a Membrane Channel", *Proceedings of National Academy of Sciences*, 93, (1996), 13770–13773.

Neugebauer, C. A., et al., "Electrical conduction mechanism in ultrathin, evaporated metal films", *Journal of Applied Physics*, 33 (1), (1962), 74–82.

Tiwari, S., et al., "CMOS and Memories: From 100 nm to 10 nm", *Microelectronic Engineering*, 46 (1–4), (May 1999), 3–6.

Tiwara, S., et al., "Single Charge and Confinement Effects in Nano–Crystal Memories", *Applied Physics Letters*, 69 (9), (1996), 1232–1234.

(Continued)

*Primary Examiner*—Christian Wilson
(74) *Attorney, Agent, or Firm*—Schwegman, Lundberg, Woessner & Kluth, P.A.

(57) ABSTRACT

A gated metal oxide semiconductor field effect transistor (MOSFET) gain cell is formed with a flow channel for molecule flow. The flow channel is formed under the gate, and between a source and drain of the transistor. The molecule flow modulates a gain of the transistor. Current flowing between the source and drain is representative of charges on the molecules flowing through the flow channel. A plurality of individually addressable gain cells are coupled between chambers containing samples to measure charges on molecules in the samples passing through the gain cells.

9 Claims, 16 Drawing Sheets

OTHER PUBLICATIONS

Volkmuth, W. D., et al., "DNA Electrodiffusion in a 2D Array of Posts", *Physical Review Letters*, 72 (13), (Mar. 1994), 2117–2120.

Welser, J. J., et al., "Room Temperature Operation of a Quantum–Dot Flash Memory", *IEEE Electron Device Letters*, 18 (6), (Jun. 1997), 278–280.

Wilkerson, C. W., et al., "Detection and Lifetime Measurement of Single Molecules in Flowing Simple Streams by Induced Laser Fluorescence", *Applied Physics Letters*, 62 (17), (Apr. 1993), 2030–2032.

* cited by examiner

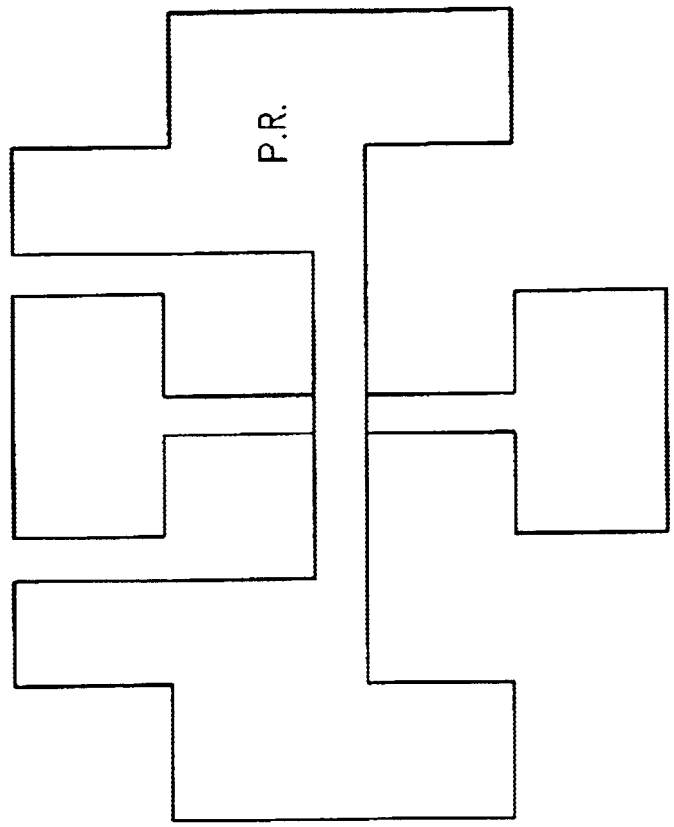
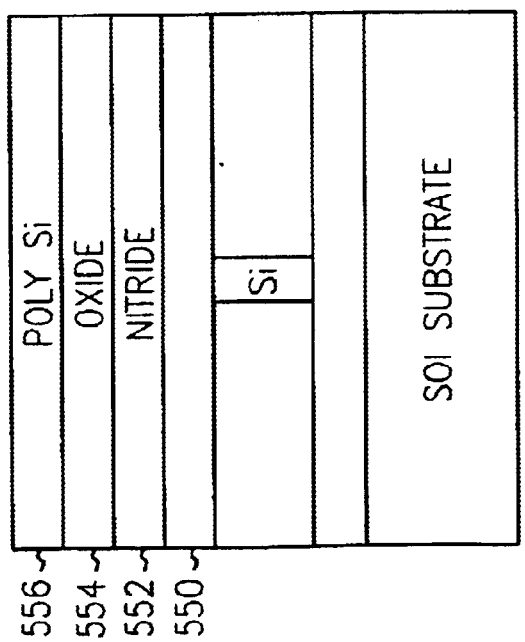
FIG. 5C

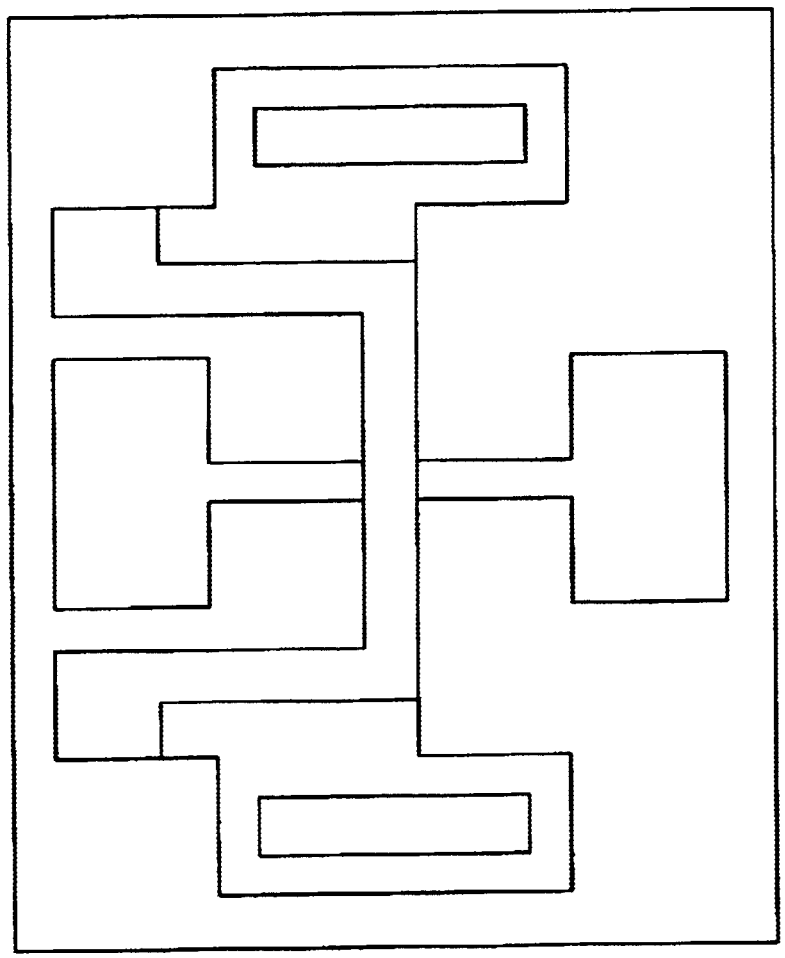
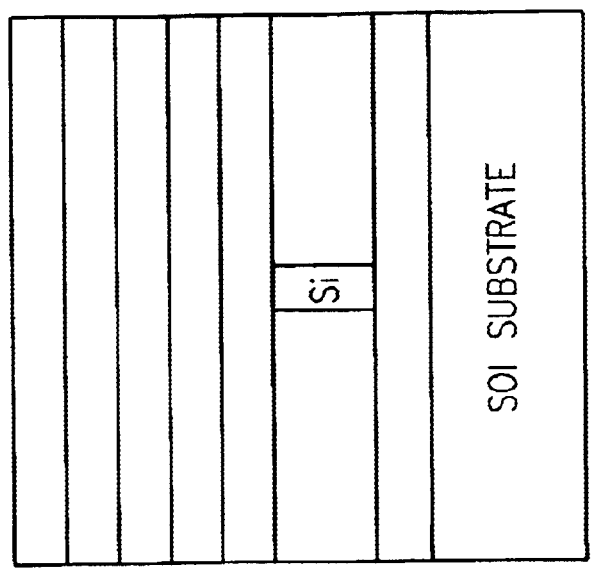
FIG. 5E

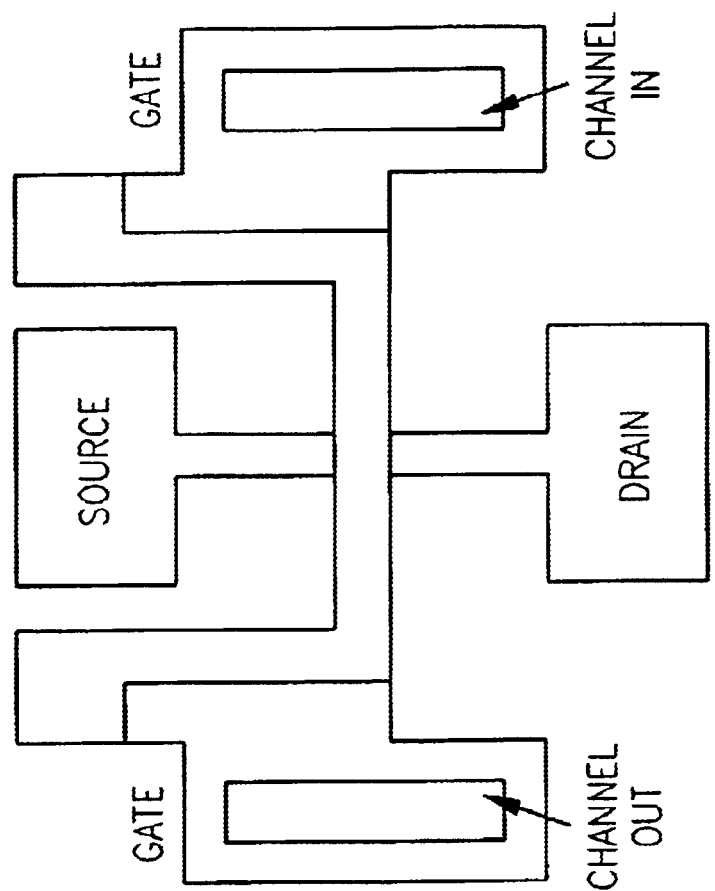
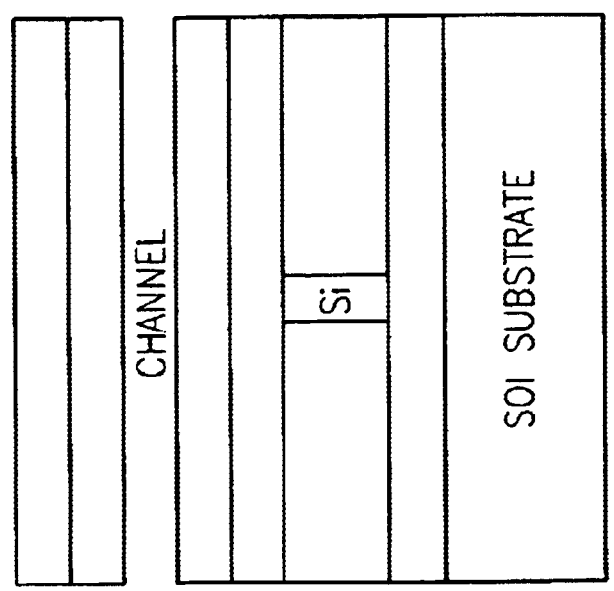
FIG. 5F

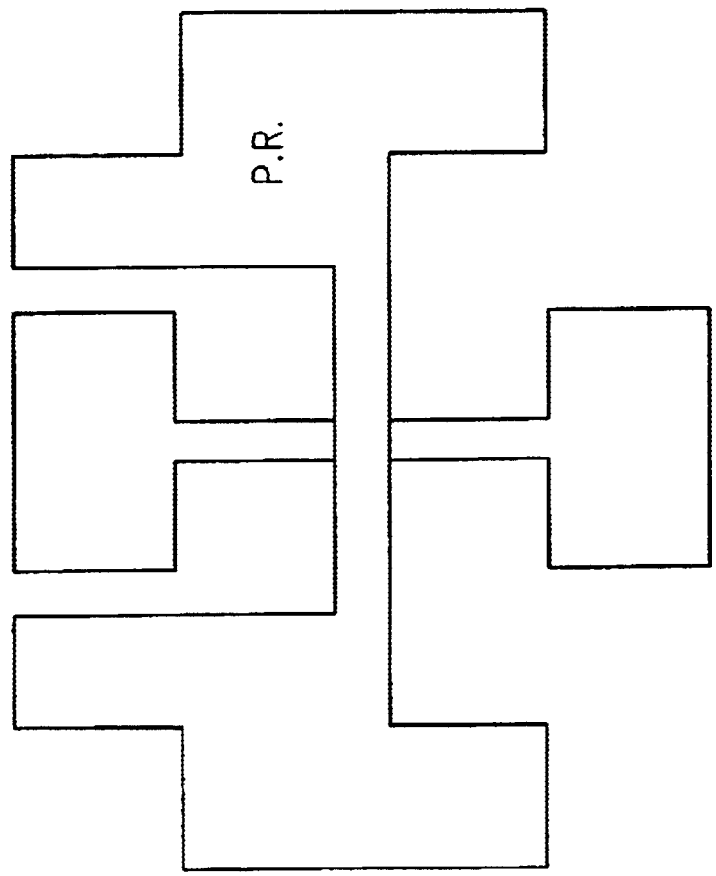
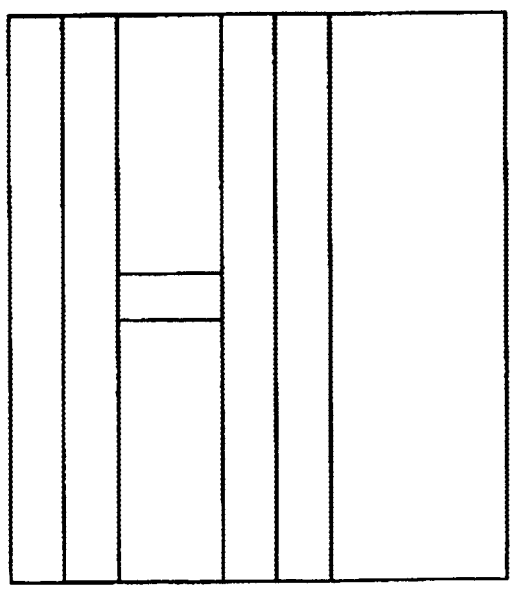
FIG. 6F

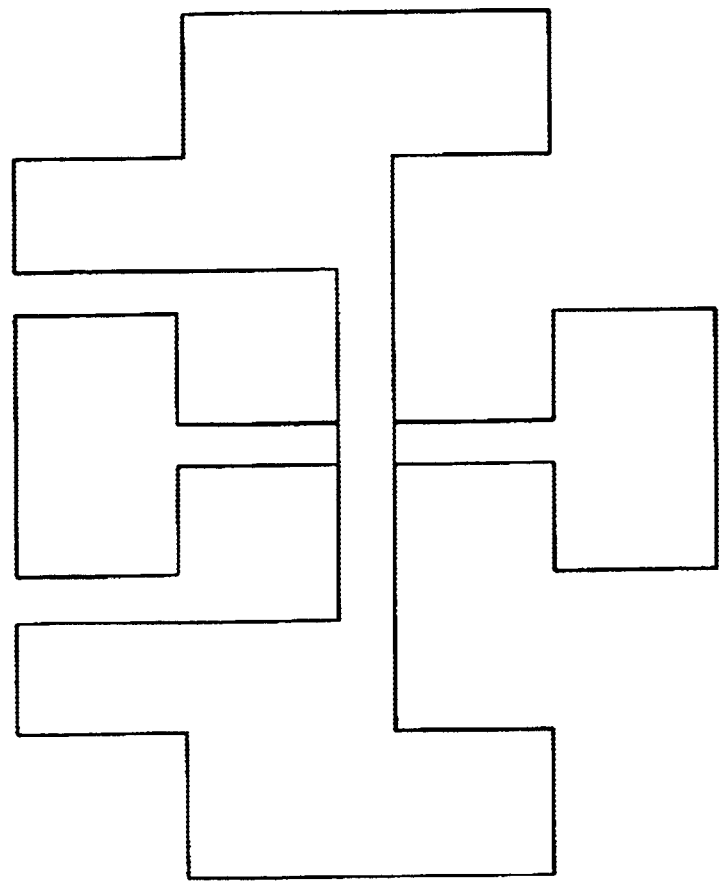
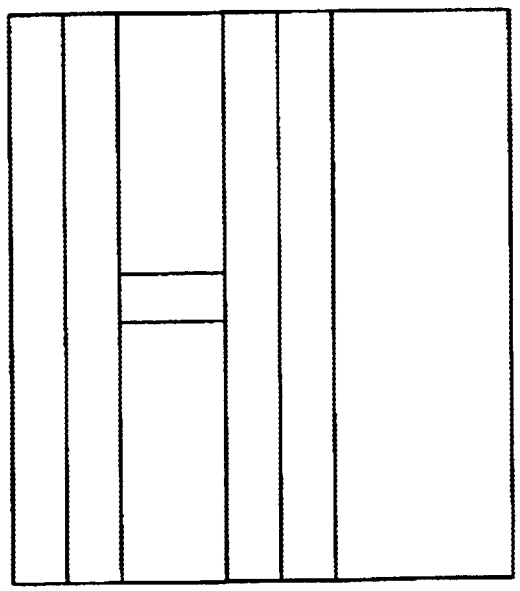
FIG. 6G

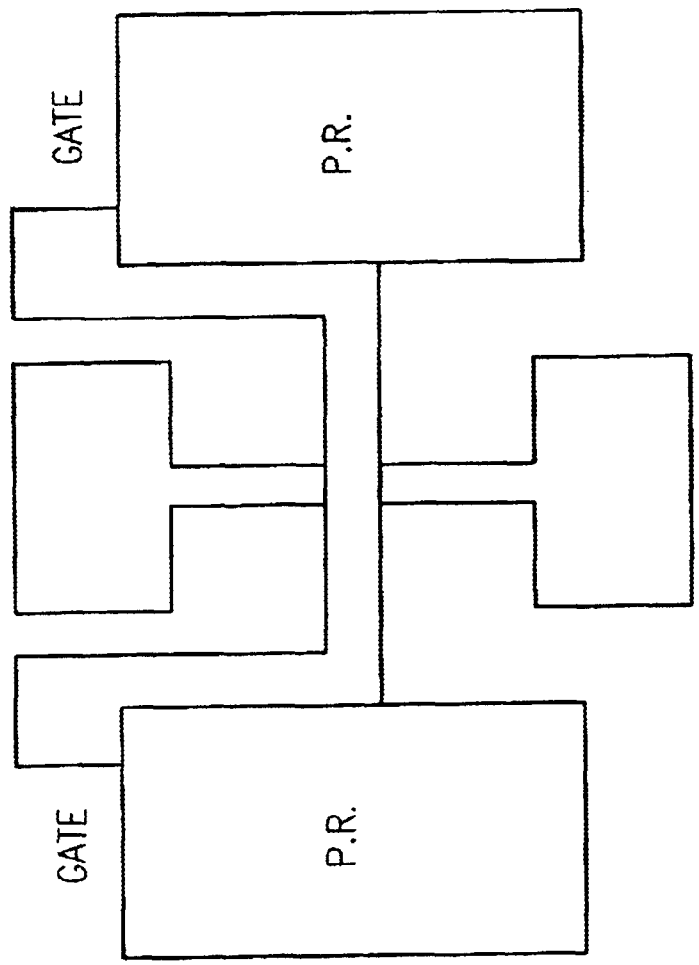
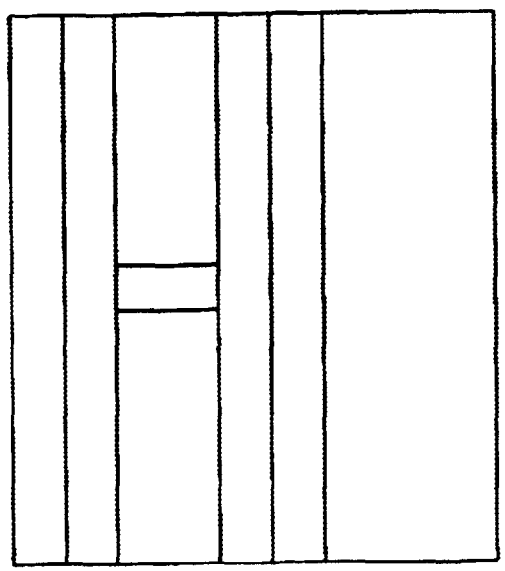
FIG. 6H

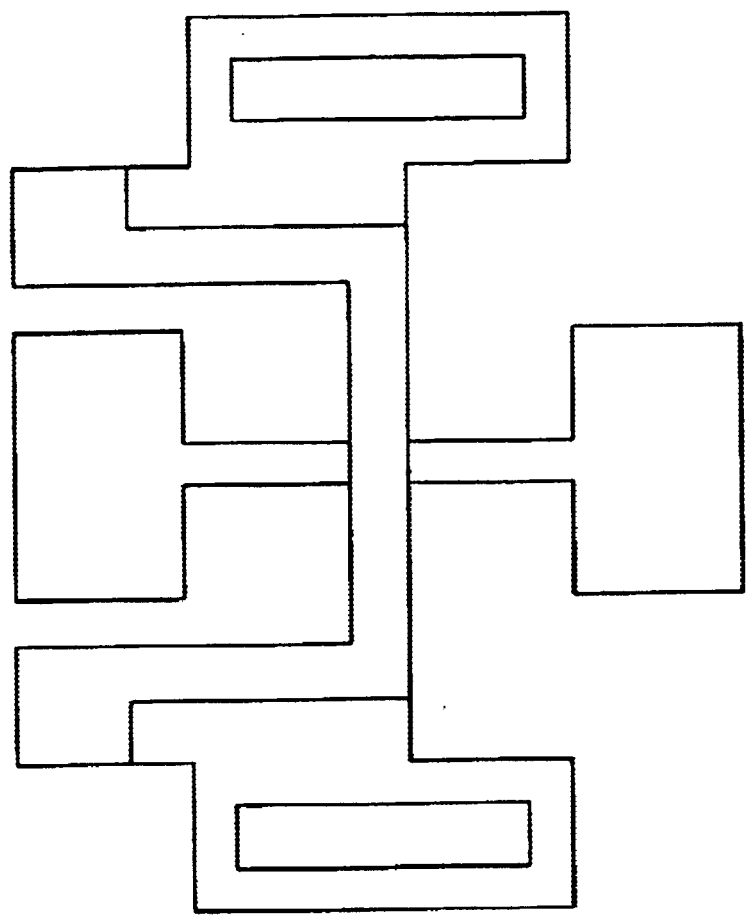
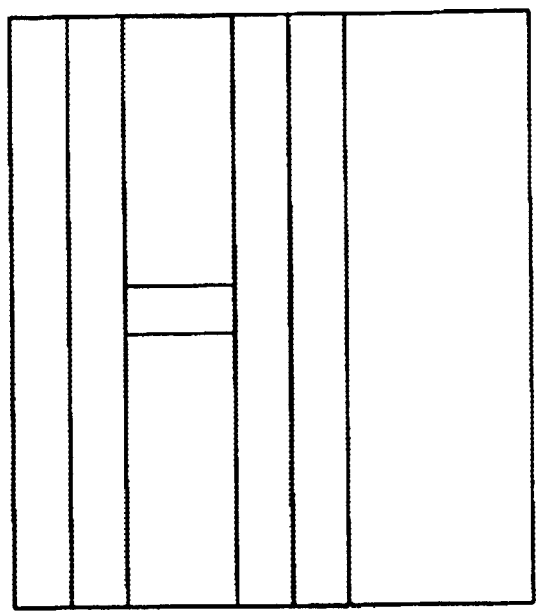
FIG. 61

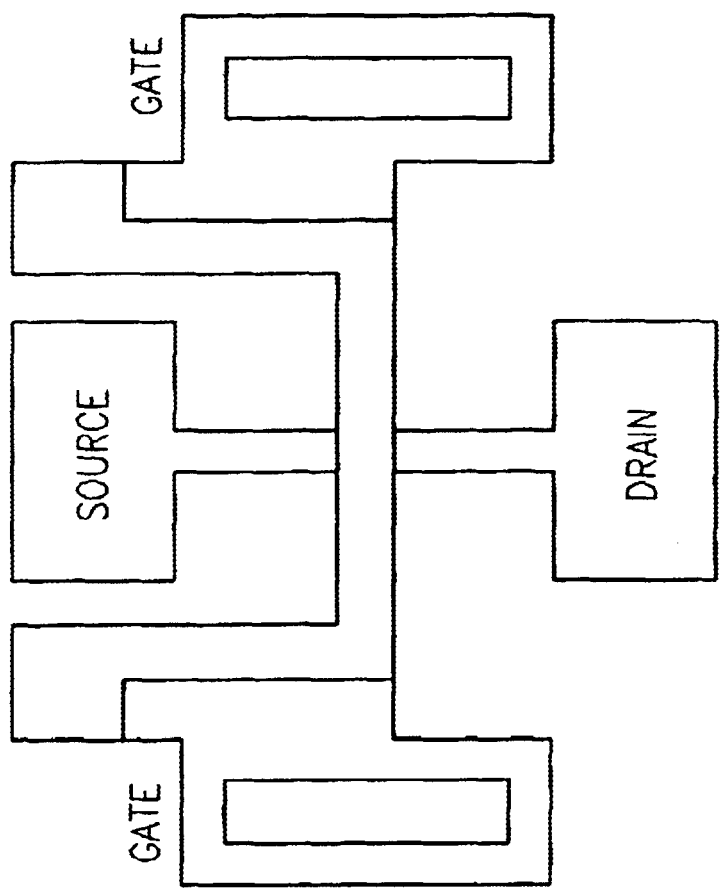
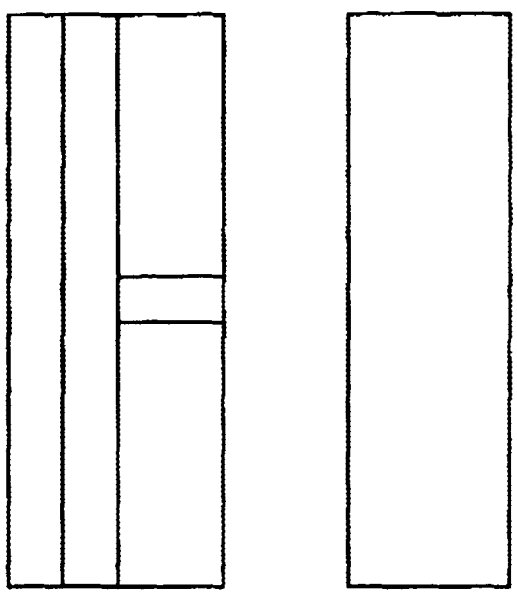
FIG. 6J

ELECTRONIC GAIN CELL BASED CHARGE SENSOR

RELATED APPLICATIONS

This application claims priority to U.S. Provisional Patent Application Ser. No. 60/365,606, filed Mar. 19, 2002, which is incorporated herein by references.

GOVERNMENT FUNDING

The invention described herein was made with U.S. Government support under Grant Number NSF ECS-9986535.

FIELD OF THE INVENTION

The present invention relates to charge sensors, and in particular to an electronic gain cell based charge sensor.

BACKGROUND OF THE INVENTION

Miniaturized bio-analytical devices have become increasingly popular in the last few years because they have provided a robust, reproducible, bio-compatible, and reusable medium for rapid and parallel sorting, characterization, and sequencing of molecules. Some examples of these devices include using microfabricated obstacles, voids, channels and sieves as synthetic gel matrices for a non-traditional electrophoretic fractionation, fluorescent and diffractive identification. Further examples include the use of near-field and far-field fluorescence from hybridized molecular fluorophores as well as antibodies and other similar molecules.

Such techniques rely on optical means for identification, and hence usually require very specific chemical modifications that are appropriate for fluorescent measurement. Coupling fluorescent dyes to antibody molecules, which then serve as highly specific and versatile labeling reagents selectively binding to specific macromolecules, provides for a powerful technique of identification. The chemical labeling, however, restricts the technique to quite specific tasks that the fluorescent dyes and antibodies are available for and is time consuming. Other optical techniques, likewise, also require specific binding to be available and characterized for the optical method to avail. A general technique that could be used for a variety of applications and that provides a direct measurement of molecules is highly desired because it could provide a more general, unambiguous, accurate, inexpensive and rapid method. One such technique uses an ion-channel in a lipid bilayer membrane. It provides a direct measure of the charge across the opening between two reservoirs of macromolecules. The magnitude and duration of the measure is related to the magnitude of charges, the flow rates and the length of the macromolecule. Depending on the field and the magnitude of the charge passing through the ion-channel, the absolute magnitude of the change in current is in the pico ampere to femto ampere range and requires a very careful low noise measurement.

In a further prior art method, the membrane slit is replaced by a pore in an inorganic dielectric membrane on silicon. Changes in current in this method characterize the transport of molecules. Both these techniques, in principle, could provide a direct high speed detection of the sequence of bases in single molecules of DNA and RNA, but depend critically on measurement of ultra-small currents and ultra small pores.

SUMMARY OF THE INVENTION

A gated metal oxide semiconductor field effect transistor (MOSFET) is formed with a flow channel for molecule flow. The flow channel is formed under a gate, and between a source and drain of the transistor. The molecule flow modulates a gain of the transistor. Current flowing between the source and drain is representative of charges on the molecules flowing through the flow channel.

In a front fluid flow channel embodiment, the flow channel is placed between the gate and the electron channel of the silicon transistor. The channel is approximately 5–20 nanometers long and approximately 1–10 nanometers in cross section. It senses charges from molecular species that are sub—10 nanometers in size.

In a back fluid flow channel embodiment, the flow channel is placed underneath a thin-silicon channel transistor. The channel is approximately 5 nanometers and larger in length, and approximately 40–400 nanometers in cross section. It senses charges from molecules that are larger in size.

Fabrication techniques utilize a high selective etchable material to form the fluid flow channels. In further embodiments, multiple parallel transistors are utilized with chambers for supplying and receiving samples to be run through the flow channels. Current measuring devices measure changes in current caused by molecules of the sample passing through the flow channels.

BRIEF DESCRIPTION OF THE DRAWINGS

FIGS. 5A, 5B, 5C, 5D, 5E, and 5F illustrate a fabrication sequence for the front fluid channel device of FIG. 1.

FIGS. 6A, 6B, 6C, 6D, 6E, 6F, 6G, 6H, 6I and 6J illustrate a fabrication sequence for the back fluid channel device of FIG. 2.

DETAILED DESCRIPTION OF THE INVENTION

In the following description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
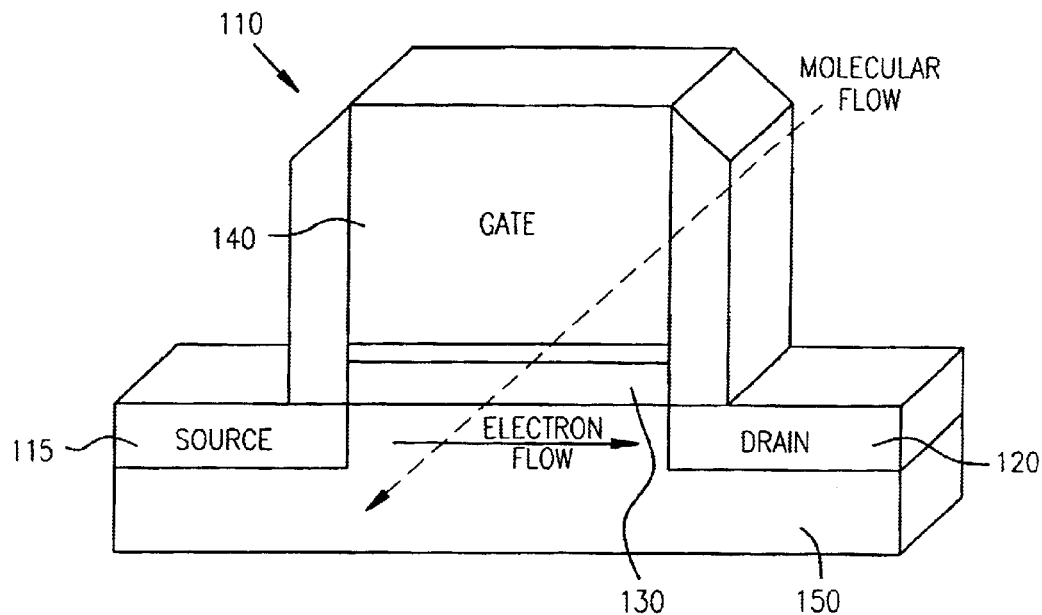
FIG. 1 is a block perspective view of a transistor having gain controlled by molecular flow through a channel under a gate of the transistor.

FIG. 1 shows a front fluid flow channel device 110 which couples an electrostatic charge on macromolecular chains (e.g., nucleic acids and polypeptides) or macromolecular complexes (e.g., double-stranded DNA, DNA-protein complexes, protein-protein complexes, and receptor-ligand complexes) to the flow of electrons from source 115 to drain 120 of a gated metal-oxide-semiconductor field-effect transistor (MOSFET) to determine size, charge, and residue composition by using the gain of the transistor. The front fluid flow channel device, has a flow channel 130, that is 5–20 nm by 1–10 nm in cross-section and placed in between a gate 140 and an electron channel 150 of the transistor made on silicon, allows single-electron sensitivity and operates with molecular species that are sub—10 nm in diameter when elongated. The gain of the transistor is modified by the electrostatic charge flowing through the flow channel 130.

Figure 2:
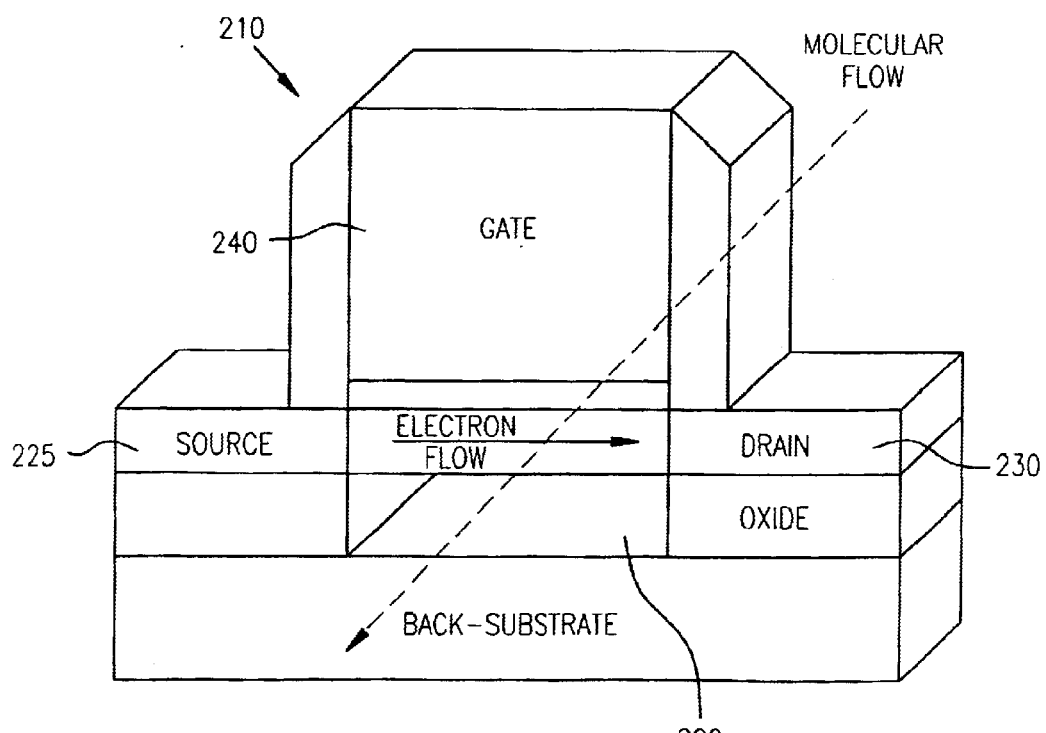
FIG. 2 is a block perspective view of a transistor having gain controlled by molecular flow through a channel beneath a thin-silicon channel transistor.

A back fluid flow channel device 210 is shown in FIG. 2. It has a fluid flow channel 220 that is 5 nm (and larger) by 40–400 nm in cross-section and placed underneath a thin-silicon channel transistor. The transistor comprises a source 225, drain 230 and gate 240. A silicon channel 245 provides for the flow of electrons between source 225 and drain 230. Device 210 provides for sensitive measurements for molecules that are larger in size. The gain of this device 210 is also modified by the electrostatic charge on molecules flowing through the fluid flow channel 220.

The front fluid flow channel device 110 is useful for electronically detecting oligonucleotides, polypeptides, single-strand DNA molecules, etc. The back fluid flow channel device 210 operates for measurements on larger molecules and macromolecular complexes with a similar size resolution but with smaller sensitivity. These devices provide a very rapid method for determining the size of macromolecules and have the potential for identifying sequences with near-atomic dimension and single-electron charge resolution, thus providing an attractive alternative to the current gel electrophoresis-based techniques for DNA sequencing.

The principle of the devices is in coupling the ionic charges on the macromolecules to the channel of a transistor, thus changing the transistor's current with a gain inherent in the use of electrostatic coupling, and producing a direct measurement of the presence of charge in the fluid channel. In the front fluid flow channel device 110, as the molecule flows under the gate and above the silicon, ionic charge is introduced between the gate and the silicon surface. This charge, which is flowing, screens the influence of the gate on the electron channel on the silicon surface: a negative charge reduces the number of electrons in the channel while the presence of a positive charge increases the number of electrons in the channel. Unlike the flow rate of the ionic charge ($\mu$m/s to cm/s molecular flow rate), the electrons flow at close to $10^7$ cm/s. This is equivalent to a gain of $10^7$ and higher in current. It is also easily detectable because of the $10^{-9}$ A current that it causes in the transistor. By making the transistor small in dimension, 10–30 nm in length and width, the capacitance is kept small (in $10^{-18}$ F.) with single electron charging energies close to thermal energy at room temperature, leading to clear low-noise measurement of the presence of charges between the gate and the channel. The flow rate of the molecules (diffusive) leads to a presence of charge for between 1 $\mu$s and 10 ms depending on size. This allows near-atomic level resolution of the charge on the molecules.

The back fluid flow channel device 210, introduces the ionic charge underneath a thin transistor channel. Its presence changes the threshold voltage of the device by screening, i.e. a change in the back-gate potential, whose effect is clearly discernible in the current conduction in the device structure. A 60–80 mV change in threshold voltage leads to a factor of 10 change in current that can be accurately measured. A larger dimension may not have the resolution of small dimension structures, however, it allows larger molecular chains and macromolecular complexes to be measured with high spatial resolution and it is more easily fabricated.

The following paragraphs describe further detail regarding operation of the devices as currently understood. If the device operates in a different manner than that understood, the invention still provides one or more of the functions described herein. The device operates on the underlying gain phenomenon in a field effect transistor. The most common form of the field-effect transistor—the silicon MOSFET (metal-oxide semiconductor field-effect transistor)—uses a gate electrode to electrostatically induce charge on the surface of silicon, thus forming a channel that connects the source reservoir and drain reservoir of charge carriers (electrons for n-channel MOSFET. The application of a potential, and hence an electric field, between the source and the drain leads to a current flow as the charge from the source reservoirs flow into the drain. A closed loop through the power sources maintains continuity in the closed system. The channel charge is induced across a dielectric insulator ($SiO_2$) that is highly insulating because of a large bandgap and barrier height, and hence little or no gate current flows between the gate and the channel, source, and drain, even as the gate effectively controls the current between the source and the drain. The device has active power gain and current gain. When the drain voltage is large enough so that drain current saturates, the saturated drain current that flows between the reservoirs is described approximately by the relationship $$I_{on} = \frac{\mu C}{2}(V_G - V_T)\frac{\alpha W}{L}$$

where $I_{on}$ is the drain current in the on-state, W and L are the width and length of the device, $\mu$ is the mobility of carriers (electrons for n-channel), C the capacitance, $V_G$ is the applied gate voltage and $V_T$ is the threshold voltage, and $\alpha$ is an exponent between 1 and 2 depending on the gate length. The threshold voltage is an extrapolated voltage at which carriers are induced in sufficient quantity to cause inversion at the channel surface and thus cause reasonable flow of current. The transistor provides a reasonable current drive at voltages above $V_T$ because of the existence of the carriers in large enough numbers. At low drain voltages the relationship between drain current and drain voltage is linear until it reaches a saturation voltage beyond which the current saturates to the value described by the equation. When the gate voltage is lower than the threshold voltage, a small current still flows through the transistor, but is now modulated by the potential barriers between the source and drain and is diffusive. It is therefore exponentially related to the gate voltage which directly influences the height of the potential barrier. The exponential drain current relationship can be approximately described by the equation:

$$I_{off} = \frac{eDkT}{Le}C\exp\left(-\frac{e(V_G - V_T)}{mkT}\right)$$

where $I_{off}$ is the sub-threshold current, D is diffusivity of the carriers, k is the Boltzmann constant, and m a factor (>1) that relates to the coupling of the barrier to the gate. In either of these regimes, the capacitance C that couples the gate to the underlying conducting regions is a primary parameter that provides a direct control on the electrons induced for conduction. The transistor provides high gain because the dielectric does not conduct and the gate provides an efficient control of the conducting charge in the semiconductor through the capacitance C.

If a charge is present between the gate and the channel, it screens the effect of the applied potential through Coulomb attraction or repulsion, and its effect is to shift the characteristics of the device to a higher or lower threshold voltage. An example of such a device, that is in common use, is the non-volatile memory, a particular case of which is the NOR flash cell. The non-volatility of the structure arises from the choice of oxide thicknesses—a high electric field 1–10 MV/cm is required to inject carriers either by hot-carrier injection or by Fowler-Nordheim tunneling. The state of the device is measured at smaller bias voltages where the stored charge in the floating gate remains undisturbed. The presence of the charge in the floating gate region is the source of the shift in the threshold voltage that leads to the shift in the current-voltage characteristics. The measurement of the current through the device provides a direct measure of the stored charge in the floating gate region because of its pronounced effect on the current-voltage characteristics.

The principle behind the device of the current invention is the recreation of this effect of floating-gate and the charge placed on it by replacing it with the ionic charge on macromolecules. We utilize the differences in the ionic charge distribution of macromolecules and the individual residues which compose these molecules. For example, nucleic acids possess a uniform negative charge due to the sugar phosphate backbone. This negative charge is proportional to the size of the molecule. If the flow channel of the gain cell is of appropriate size, individual single-stranded DNA or RNA molecules will pass through this channel as extended linear chains whose presence will be detected as a change in the flow of electrons from source to drain. The duration of this signal will be proportional to the size of the molecule. Thus, this device is useful in determining the size of these macromolecules. Moreover, with appropriate sensitivity, the device may be able to identify individual nucleotides of an oligonucleotide chain. In theory, a single purine or pyrimidine nucleotide passing through the gain cell should influence the electron flow in a manner characteristic of its molecular size and chemical composition making it possible to detect individual bases as the molecule traverses the channel providing sequence information of individual oligonucleotides. Similarly, this method of electronic detection should also be useful in determining the size of polypeptide chains and possibly in distinguishing between individual amino acid residues of these chains. Gain cells with larger fluid channel dimensions are useful for detecting macromolecular complexes, such as DNA hybridization, protein-protein complexes, DNA-protein complexes, and possibly receptor-ligand interactions (e.g., antibody-antigen complexes). This should be possible because many of these interactions involve electrostatic bonds, thus the charge distribution of the macromolecular complex will be different from that of the individual macromolecules.

Changes in the gain cell design are made in some embodiments to accommodate the sizes encountered in variety of molecules and to obtain operation with reasonable voltages on the gate. In one embodiment, device dimensions are reduced and in a further embodiment an additional gate is placed on the back of the channel through which electrons flow.

Single Electron Sensitivity Through Size Control

As microelectronic geometries have become smaller, the magnitude of the capacitances has been decreasing. As dimensions reach ~10 nm, the capacitance becomes extremely small, the electrostatic energy required to place an electron on the small capacitance ($e^2/2C$) becomes large and begins to approach thermal voltages even at room temperature, thus resulting in direct observation of discreteness in characteristics due to single-electron events. Single-electron events have been observed in a single electron transistor which was made with higher capacitance but allowed measurement at low temperatures. Recently, the ability to control dimensions into the nanometer-regime has led to structures such as the quantum-dot memory and the nano-crystal memory.

In the quantum-dot memory, the field-effect of the transistor is coupled to the discreteness effect of small capacitances of small storage volumes (the quantum-dot). A dimension of ~30 nm is utilized to form the gate, and a silicon floating gate region (the quantum-dot) is formed above the silicon channel at the crossing of the channel and the gate. This memory is formed on a silicon-on-insulator substrate due to the use of small dimensions and hence the need to reduce substrate conduction. The smallness of these dimensions leads to observation of single electron events as the electrons are placed on the floating gate. As the gate voltage is increased and hence its electrostatic potential lowered, electrons get injected into the floating quantum-dot. Each change in charge in the quantum-dot screens the gate electrode, thus increasing the threshold voltage of the device. The drain current-gate voltage characteristics shift to the right. A higher gate voltage is now needed to achieve the same drain current. Each one of the single electron events appear as a step in the drain current-gate voltage characteristics. The cumulative effect of the storage of electrons appears as a hysteresis in the device behavior. Because of the use of small dimensions, presence of approximately seven electrons in the floating gate led to the large 0.75 V hysteresis.

Another memory that utilizes the sensitivity achieved through use of small dimensions is the nano-crystal memory. Here, nano-crystalline islands of silicon are placed on the oxide. Charge stored in them are used to control the flow of the charge in the channel underneath. A threshold voltage shift arises from the use of these small sized islands with low capacitance. Again, the discreteness of the single electron effects is coupled to the conducting carriers in the channel. The magnitude of the effect underneath the stored charge, as measured in threshold voltage (or equivalently the gate voltage for achieving similar conduction), is:

$$\Delta V_T = \frac{e\bar{v}}{\varepsilon_{ox}}\left(t_{cntl} + \frac{1}{2}\frac{\varepsilon_{ox}}{\varepsilon_{dot}}t_{dot}\right)$$

where $t_{cntl}$ is the thickness of the oxide between the gate and the charge (a control oxide), $t_{dot}$ is the thickness of the quantum-dot, the $\in$'s the permittivity of the oxide and dot, and v the number of electrons per nano-crystal.

The closer the charge is to the channel and the farther is it from the gate (a lever-arm effect), the larger is its effect in screening and the larger the threshold voltage shift. In the exponential region of conduction, a threshold shift of 250 mV due to a single charge implies a current change of $\exp[-(250 \text{ mV}/26 \text{ mV})]$ at room temperature—an effect of more than 4 orders of magnitude. This is observable in the drain current characteristics. Storage of the charge leads to the large hysteresis. At a gate voltage of 0V, presence or absence of charge leads to a difference in current of more than 4 orders of magnitude. The discreteness due to the single electron storage effects is observable in the last measurement of the figure. As gate voltage is increased steps are observed in the measured threshold voltage. Each step corresponds to the condition at which, on average, one additional electron is now stored in the nano-crystal quantum-dots.

The effect of ion charge on a molecule is similar to the effect of a stored electron so long as they are electrostatically coupled in a similar way. When the floating gate, which was a bound volume, is replaced with a fluid channel, still placed between the gate and the substrate surface, and through which ionic charge flows, such as in FIG. 1, the current changes occur in a way similar to the quantum-dot memory and with similar sensitivity. Since the width dimension of the device is also very accurately defined, the time for which the molecule dwells in the channel can be measured and the charge location identified with near-atomic resolution. Techniques of making the quantum-dot memory with an enclosed volume are applied to making a flow channel with similar size resolution that can be subsequently reduced in pore size by oxidation of silicon.

This technique allows measurement on small macromolecular structures, but requires a challenging fabrication of the structure and may be unsuitable for larger macromolecular complexes such as double-stranded DNA, protein-DNA complexes, or protein-protein complexes. The device dimensions themselves are not easily scaled arbitrarily in thickness because that leads to large voltages. In one embodiment an additional structure is fabricated with larger dimensions and simpler fabrication, that is based on coupling of charge from the back of the channel.

High Gain with Back Gated Control

Figure 3:
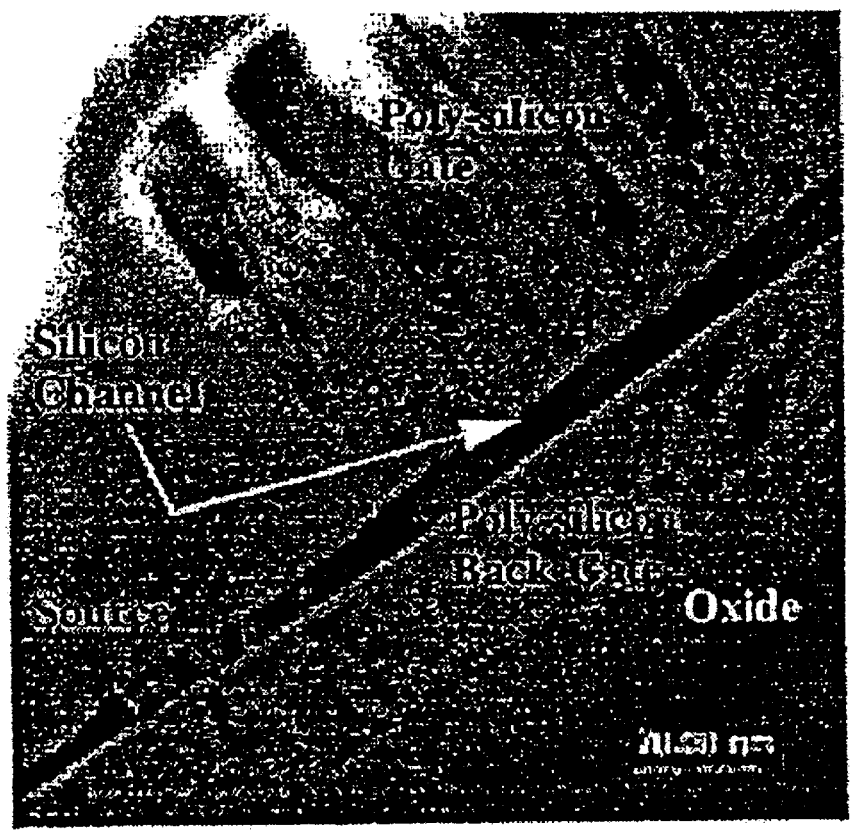
FIG. 3 is a micrograph of a fabricated back-plane transistor structure using a thing silicon channel.
Figure 4:
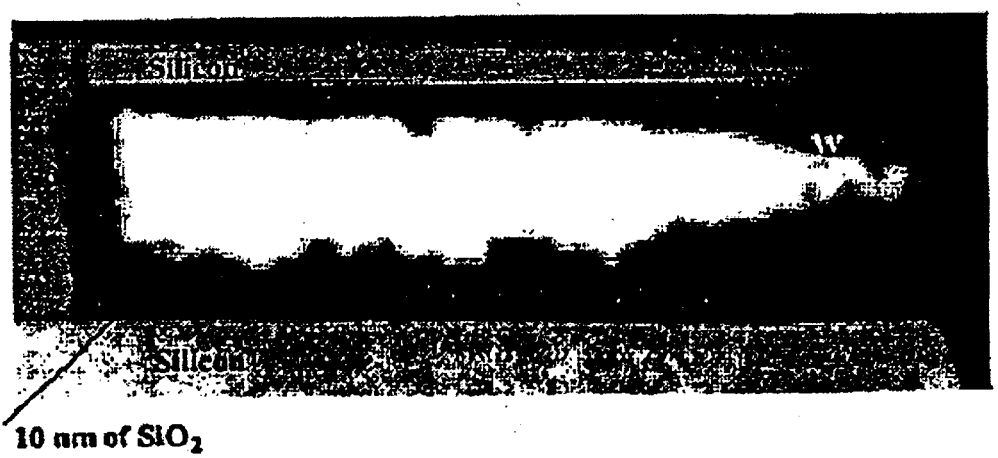
FIG. 4 is a cross section of the transistor of FIG. 3 showing a fluid channel formed under the transistor.

In principle, the approach of introducing a fluid channel on the back of the silicon electron channel, is similar to the back-plane transistor or the back-plane floating gate memory, which place the back-gate (connected or floating) on the back of the transistor channel. In addition to the front poly-silicon gate and source and drain, it also has a gate on the back of the silicon channel through which transistor electron conduction occurs. Its uniqueness is in the ability to control the front transistor characteristics by applying a potential to the back-gate. The back-gate changes the threshold voltage in a similar way as the front floating gate, but with different scaling rules. A large change in current-voltage characteristics is obtained by application of a gate bias. A positive bias voltage (similar in effect as a positive ionic charge on the back) leads to a higher current and a negative bias voltage (similar in effect as a negative ionic charge) leads to a reduction in current. The characteristics also show the increase achieved when both gates are biased identically. A large change in current can be observed with a small change in the back-gate potential. Similar to the single-electron resolving structure, in one embodiment the back-gate region is replaced, through which macromolecules can now flow. An example of such a channel formed using silicon-on-insulator is shown in a micrograph in FIG. 3 and cross section of FIG. 4. While these figures show a deposition in the flow channel, it can also be reduced in size through oxidation. When macromolecules flows through the flow channel on the back, the ionic charge on them can be measured by monitoring the current of the transistor above. The back-gate region is thicker (between 30 nm and 400 nm) and the devices wider, thus permitting larger molecules to transport through the structure, albeit with poorer charge resolution.

Replacement of Floating Gate by Fluid Channel: Front Fluid Channel and Back Fluid Channel Cells The effect of charge storage or potential change of electrodes is enormous and results in large changes in current in a transistor. The floating gate or back-gate region, which show these large effects, is replaced by a fluid channel. Schematically, this results in structures shown in FIGS. 1 and 2, where the front fluid channel cell achieves the high charge and size sensitivity by virtue of the use of very small dimensions with low capacitances, and the back fluid channel cell achieves high gain by electrostatic coupling from the back and use of transistor gain. The pore size in these structures can be controlled by oxidation of the silicon from the gate and from the substrate in the front fluid channel cell, and from the channel and the back-substrate in the back fluid channel cell. Thus, when sufficiently small pore size is obtained, it forces only single-stranded segments to pass through and also results in the rest of the molecule to unravel. In artificial membranes, the time for passage of a DNA molecule in a small pore is about a micro-second per base. In a fluid channel of the present invention, this time is slowed by the presence of the lateral extant due to viscous resistance. This resistance for a rectangular channel is:

$$R = \frac{12\mu L}{wh^3}$$

where R is the fluid resistance, $\mu$ is the viscosity, L is the length (m), w is width (m) and h is the depth (m). At 10 C and higher, the flow rate appears to be sufficient in our estimated cell structures for the high resolution measurements to be effective. The devices are formed using conventional silicon processing that allows the smaller dimensions and the back-fluid channels to be achieved.

Figure 5A:
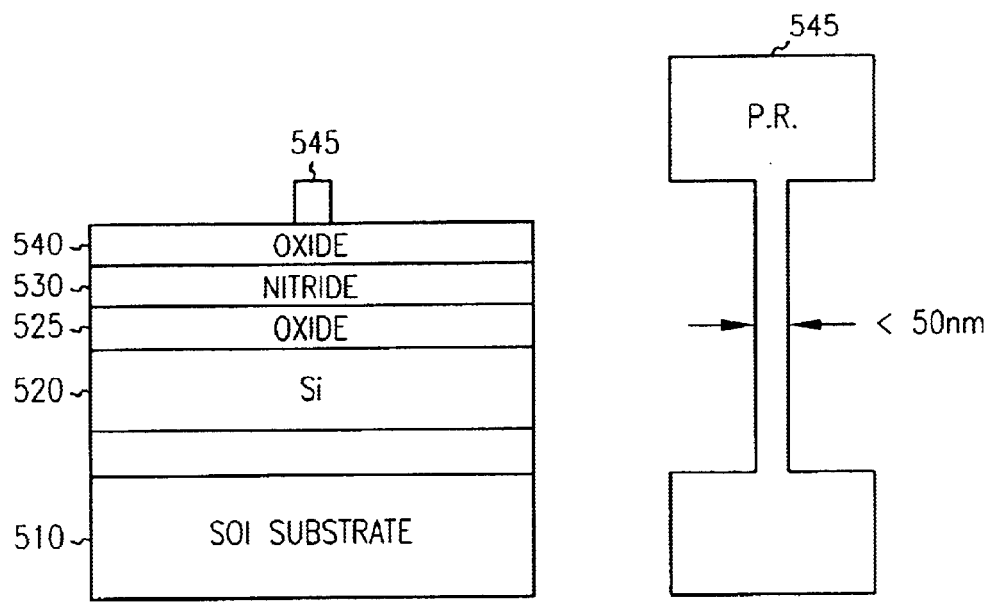
Figure 5B:
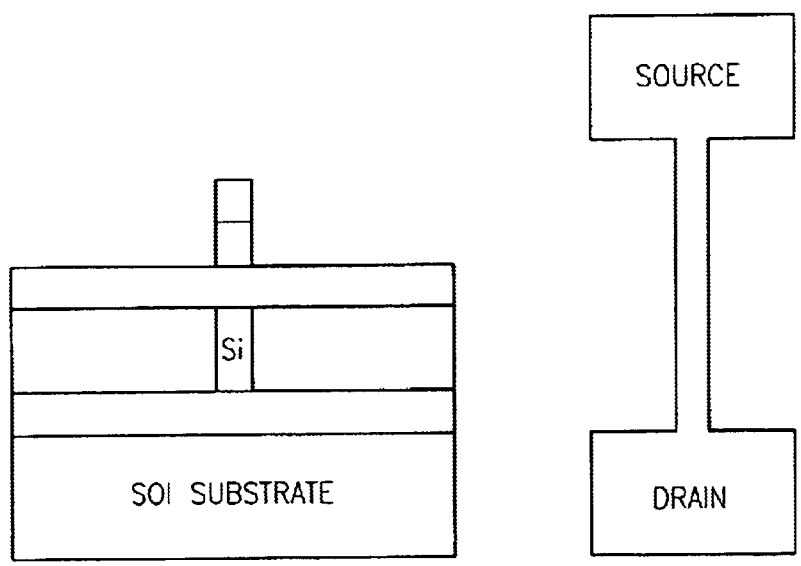
Figure 5D:
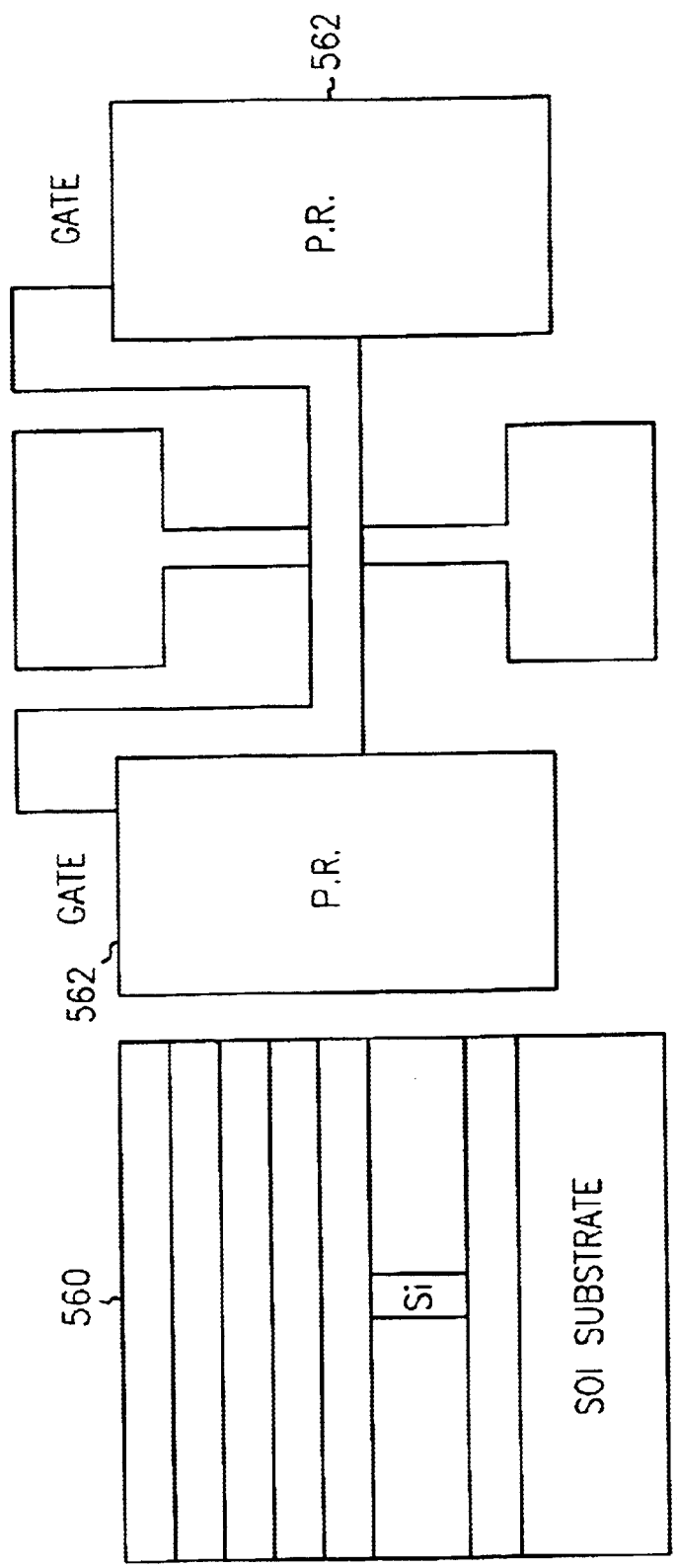

Front Fluid Channel Cell: Single Electron Sensitivity with Near-Atomic Resolution FIGS. 5A through 5F show fabrication steps for the front fluid channel cell 110 of FIG. 1. The essential purpose of the fabrication is to achieve a structure with low capacitance and small flow channel opening. Low capacitance requires gate dimensions in the 10–30 nm range and these are obtained by lithography. The small channel opening is obtained by self-aligning it under the gate and by reducing its size through oxidation—a process that consumes silicon from the gate and the surface and expands it into the flow channel. The fabrication sequence makes judicious use of the dry etch selectivity between silicon nitride and silicon dioxide, between silicon dioxide and silicon, and the wet-etch selectivity of silicon nitride using hot phosphoric acid, to fabricate the transistor with the channel underneath the poly-silicon gate and at the intersection of a poly-silicon gate line running on a silicon channel. The fabrication method follows the techniques used to fabricate the quantum-dot memory described earlier. FIGS. 5A and 5B show the formation of the narrow width silicon channel region. Starting with a silicon-on-insulator substrate 510 with a thin silicon 520, a thin sacrificial oxide 525 is grown, and a nitride 530 and oxide 540 are deposited on it. The channel pattern is then formed in photoresist 545 using electron-beam lithography at dimensions of less than ~50 nm. This is used to etch through the nitride. After stripping the resist, the nitride is used as a mask to oxidize the excess silicon, thus defining the silicon channel. Now the gate and the flow channel need to be formed at similar small dimensions. The nitride and sacrificial oxide are stripped, a new oxide 550, nitride 552, oxide 554, and poly-silicon 556 stack formed. The gate and flow channel region is defined, as shown in FIG. 5C, using electron-beam lithography and the structure etched through the nitride onto the oxide. An implant and anneal are performed to form the doped electrode regions of the transistor. Oxide 560 is now deposited on the structure, and the gate region is isolated by etching excess poly-silicon using photoresist mask 562 as shown in FIG. 5D. To open the channel region, following FIGS. 5E and 5F, a via opening is etched using photoresist into the nitride (the rest of the area is now covered with oxide). The nitride tunnel which runs under the gate is now etched by using hot phosphoric acid—a highly selective etchant. The tunnel, thus formed, is optionally reduced in size by oxidation and the electrodes of the transistors connected. Fluid reservoirs are connected to the flow channel of completed device.

Back Fluid Channel Cell: High Gain with High Spatial Resolution

The back-channel device is fabricated using silicon-on-insulator substrates with thicker oxides and follows the methods developed for fabrication of the back-plane transistor described earlier. The process sequence for fabricating the transistor is shown in FIGS. 6A–6J. The structure is formed using a silicon-on-insulator structure where the oxide underneath the silicon of the transistor is removed and replaced by another material (nitride) that is selectively etched off.

Figure 6A:
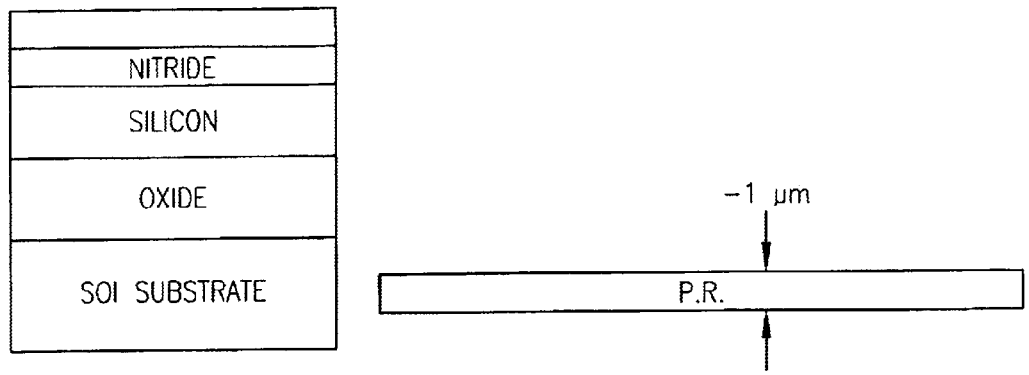
Figure 6B:
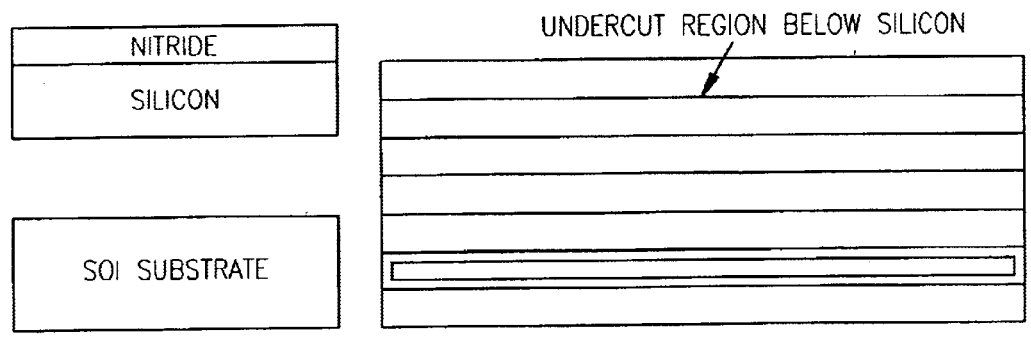
Figure 6C:
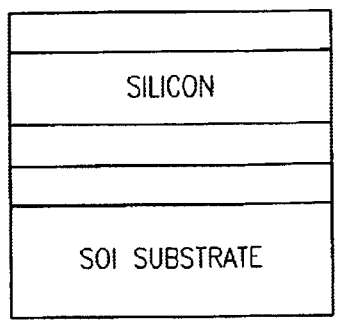
Figure 6D:
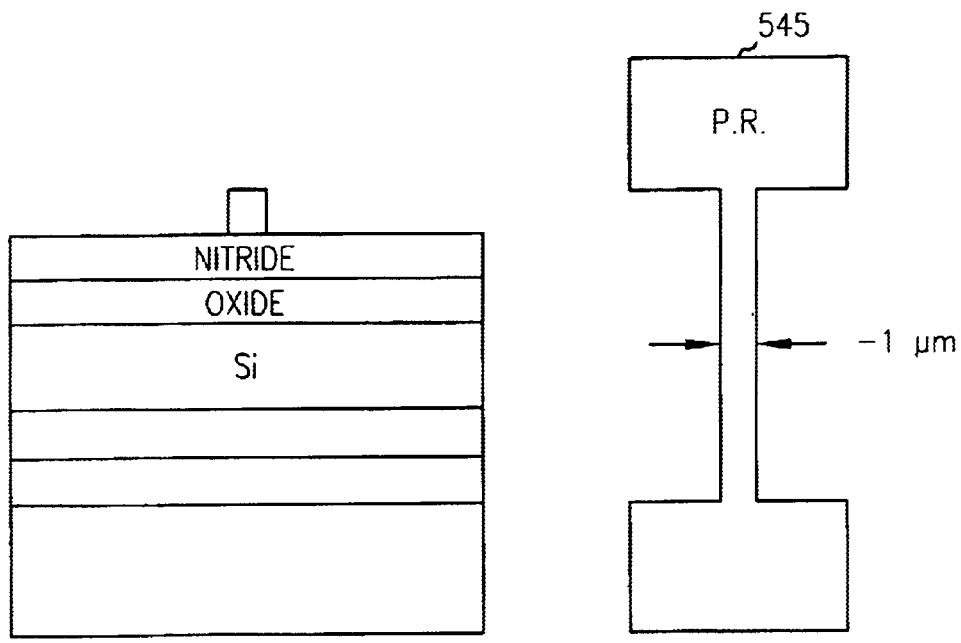
Figure 6E:
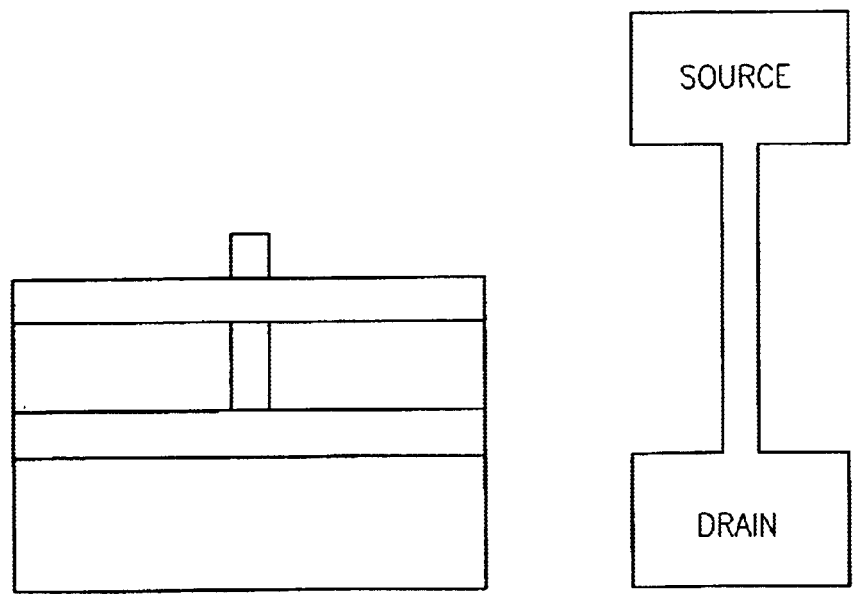

In the front channel device of FIG. 5, this occurred naturally in the stack deposition. Here, it is achieved by first depositing a nitride, opening a hole in the nitride that is then cut through the silicon to the underlying oxide of silicon-on-insulator as shown in FIG. 6B. Buffered HF now allows undercutting of the bottom oxide. After a short oxide growth to preserve the quality of silicon surface cavity is filled with nitride and polished, such as by chemical-mechanically polishing to obtain a smooth surface. This results in a silicon-on-insulator substrate in which the insulator underneath the silicon transistor region is nitride and not oxide. Transistor processing is now quite conventional. In FIGS. 6D and 6E, a patterned nitride-oxide stack is used to define the channel region of the transistor by oxidation. Dimensions for this device are ~1 $\mu$m. After stripping the stack, and regrowing the gate oxide in FIG. 6F, and depositing the poly-silicon, a pattern that defines the gate and the channel region is formed. The structure is etched through poly-silicon to the gate oxide as shown in 6G. At this point, the device source, drain and gate regions are doped by implantation and annealing following a very small oxide growth to remove the gate damage. In FIGS. 6H and 6I, additional oxide is deposited, and the channel region is spatially isolated from the gate. A hole is etched in through the oxide into the underlying nitride, and as shown in FIG. 6J, the nitride is selectively etched using hot phosphoric acid. The structure is now available for interconnects and for connections for the fluid flow.

Figure 7:
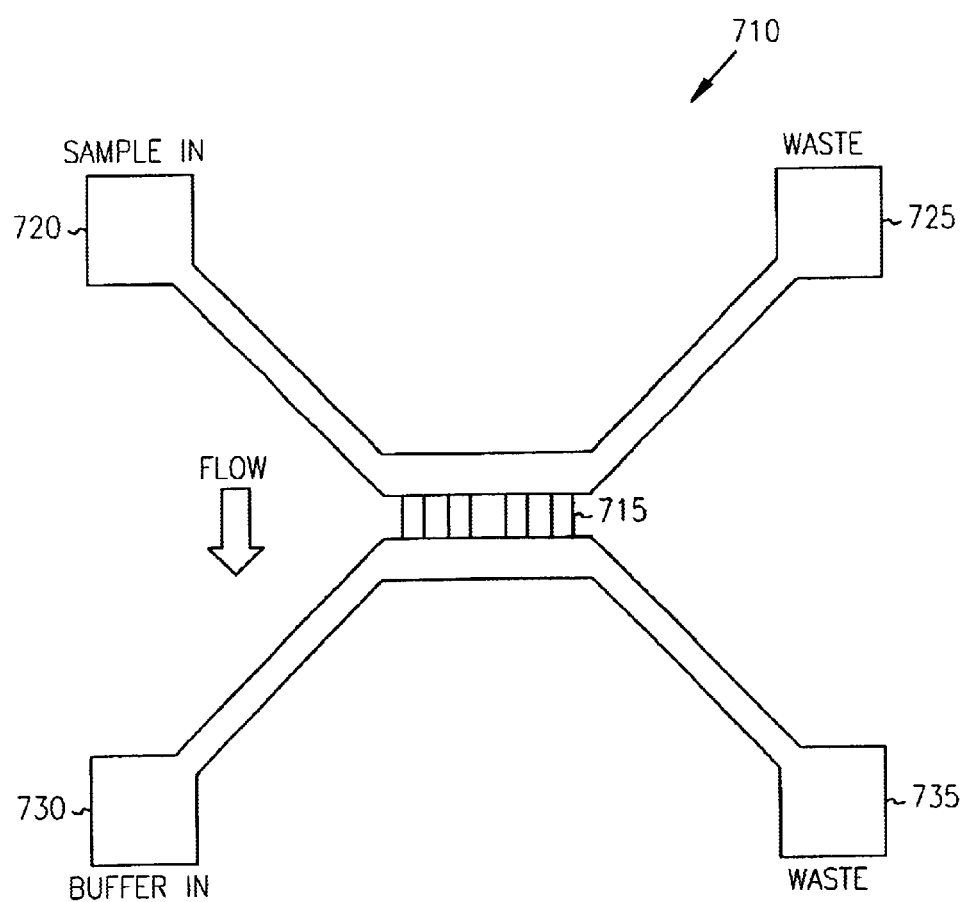
FIG. 7 is a block diagram showing a fluid flow apparatus for use with the devices of FIGS. 1 and 2.
Figure 8:
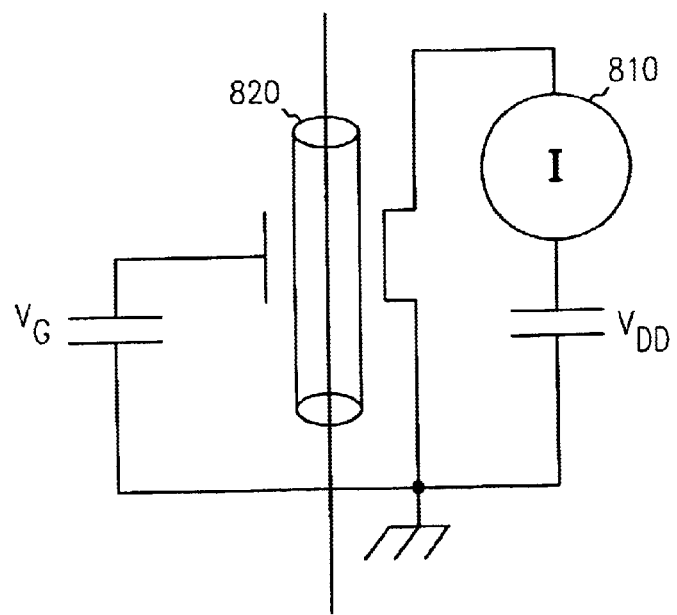
FIG. 8 is a circuit diagram for use with the device of FIG. 1 to determine influence of ion charge flow.
Figure 9:
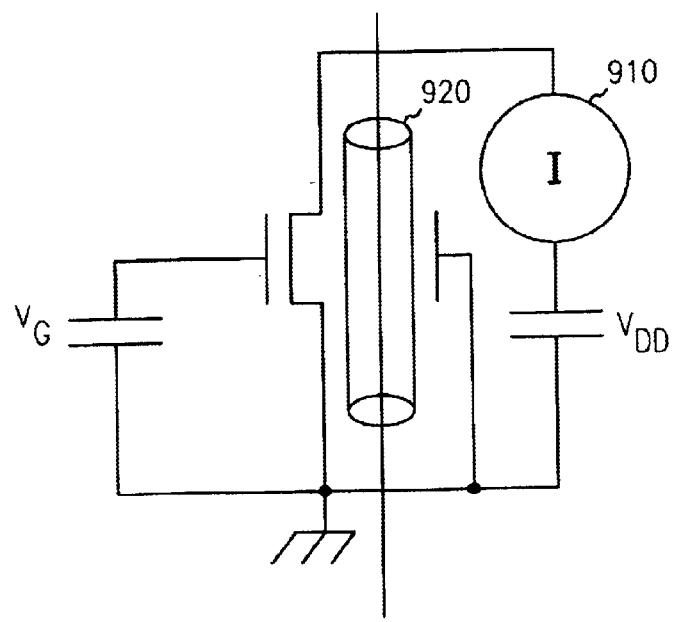
FIG. 9 is a circuit diagram for use with the device of FIG. 2 to determine influence of ion charge flow.

A schematic diagram of a system 710, for measurements, by the device is depicted in FIG. 7, together with electrical circuit diagrams in FIGS. 8 and 9. Two microfluidic chambers are separated by the flow channels of a plurality of individually addressable gain cells 715. Further channels or micro-tubes transport the fluid to and from the gain cells and between the chambers. The sample is loaded in a sample chamber 720 in an inlet port by means of a micro pipette; excess sample is discharged out a waste port 725. An appropriate buffer is similarly loaded in a buffer chamber 730 of the device. An additional waste chamber 735 is formed on the same side of the gain cells as the buffer chamber 730. Macromolecules are allowed to passively diffuse from the sample chamber 720 to the buffer chamber 730 by traversing the flow channel of the gain cells. The signal from the gain cells are detected as the molecules diffuse into the buffer chamber. Passive diffusion of macromolecules through channels of this size is used in one embodiment, and movement of the macromolecules is facilitated through the channel by applying a positive pressure to the sample chamber to induce a fluid flow through the gain cell in a further embodiment. The pressure differential ($\Delta$P) needed to induce a fluid flow at a flow rate Q through a rectangular channel can be determined from the following equation:

$$\frac{\Delta P}{Q} = \frac{12\mu L}{wh^3}$$

where $\Delta$P is the pressure difference in N/m$^3$, Q is the flow rate in m$^3$/s, $\mu$ is viscosity, L and W are channel length and width in m, and h is the channel depth in m.

System 710 is useful in characterizing the size of polypeptide chains. Polypeptides are denatured by heating in the presence of the detergent sodium dodecyl sulfate (SDS). Treatment with SDS elongates the polypeptide chain and gives it a uniform negative charge proportional to its length, similar to nucleic acid chains. Elongated polypeptide chains should pass through the channel of the gain cell in a similar manner as described for oligonucleotides and the signal from the gain cell should be proportional to the length of the molecule. Alternatively, the polypeptides can be denatured by heating the system. The amino acid sequence of individual polypeptide chains are determined as the molecule traverses the gain cell since individual amino acid residues may influence the electron flow of the gain cell differently depending on the molecular size and chemical properties.

The system containing gain cells with larger channel dimensions are used to characterize macromolecular complexes such as DNA hybridization, DNA-protein complexes, protein-protein complexes, and possibly protein-ligand interactions. Since these macromolecular complexes would have different chemical characteristics than the individual macromolecules, the effect on the flow of electrons in the gain cell as the macromolecules traverse the channel is different. Thus, the gain cell could be used to measure macromolecular interactions and possibly receptor-ligand interactions. Both the front channel and back-channel structure result in a transistor with a silicon channel for the flow of electrons. The transistor terminals available for biasing are the source, gate and the drain. In the case of the back-channel device, the substrate is grounded or placed at a constant potential also.

FIG. 8 shows a schematic diagram for measurement to be made on the front fluid channel. FIG. 9 shows a schematic diagram for measurement to be made on the back fluid channel structures. The transistors will be biased in the region of maximum sensitivity. This is in sub-threshold region to obtain the maximum influence of the ion charge of macromolecule on the silicon channel current. The current is measured at current measuring circuits 810 and 910 in time domain with fA to $\mu$A precision using low noise instrumentation during the fluid flow through channels 820 and 920. The back-substrate of the back fluid channel cell is biased at the operating point of maximum sensitivity. In one embodiment, the circuitry is formed in the same substrate as the gain cells or chambers.

CONCLUSION

In one embodiment, the transistors provide a structure useful to rapidly determine the size of macromolecules, and in yet a further embodiment, identifies sequences with near-atomic dimension and single-electron resolution.

The devices and technique provide a sensitive measurement of electronic charge and atomic level resolution using current gain and thermal insensitivity. The apparatus is compact and operates over a wide temperature range. The technique is rapid, does not use time-consuming chemical labeling and provides a convenient new electronic means of characterizing the size of macromolecules and detecting macromolecular interactions with the possibility of sequencing single-stranded DNA through a reusable apparatus.

The devices introduce gain in the measurement and a size reference through the geometry of the structure. This provides ultra-small charge sensitivity in probing the macromolecule and near-atomic level resolution. The devices are very small, providing a new nano-scale bio-analytical device that combines the ability of modem semiconductor devices in providing gain with low noise, and in having elementary charge sensitivity at the smallest dimensions, to achieve, on a flowing macromolecule, charge and spatial resolution reaching elementary charge and atomic dimensions. In addition, because of its basis in silicon microelectronics, it provides bio-compatibility with parallelism, robustness, reproducibility and accuracy associated with microelectronics.

Fabrication of the devices is performed using known semiconductor processing techniques. While certain techniques have been described for forming layers, other techniques are equally applicable as known in the art. Photolithographic techniques may be replaced by x-ray lithography or other techniques, and layers may be grown and processed in many different manners without departing from the scope of the invention.

Directly reading nucleotide sequences by measuring current as individual elongated nucleic acid molecules pass through a gain cell provides for a novel alternative to electrophoretic separation techniques. The electronic response of the gain cell is rapid and sensitive (electronic time constants are in nano-seconds and below, and gain is $10^3$–$10^4$), thus allowing for a very rapid and high resolution measurement: in the case of front-channel device it potentially allows for atomic and single-electron level resolution in dimension and charge, and in the case of back-channel structure it provides for a more conservative high resolution measurement with a simpler fabrication sequence.

Detection and characterization of macromolecular complexes is a further potential benefit of the present invention. A back-channel gain cell structure containing larger channel dimensions is used to distinguish between individual macromolecules and complexes of DNA-DNA, DNA-protein, protein-protein, and possibly receptor-ligand interactions. The reproducibility of the silicon fabrication technology and the ability to parallel process leads to very rapid sequencing. This is achieved by cutting up or fragmenting a target genome in several hundreds of pieces for the measurement followed by assembling of the sequence data. Rapid characterization of macromolecules with high resolution is provided.

What is claimed is:

1. A gain cell for detecting molecular charges, the cell comprising:
    a substrate;
    a drain and source formed on the substrate;
    a gate formed at least partially between the drain and source; and
    a flow channel formed proximate the gate.

2. The gain cell of claim 1 wherein the gain cell comprises a gated metal oxide semiconductor field effect transistor.

3. The gain cell of claim 2 wherein the flow channel is formed between the gate and an electron channel of the transistor.

4. The gain cell of claim 3 wherein the flow channel is approximately 5–20 nanometers long and approximately 1–10 nanometers in cross section.

5. The gain cell of claim 4 wherein the gain cell detects charges from molecular species moving through the flow channel that are approximately sub 10 nanometers in size.

6. The gain cell of claim 1 wherein the gain cell comprises a thin-silicon channel transistor.

7. The gain cell of claim 6 wherein the flow channel is formed beneath the thin-silicon channel.

8. The gain cell of claim 7 wherein the flow channel is approximately 5 nanometers and larger in length and approximately 40–400 nanometers in cross section.

9. The gain cell of claim 8 wherein the gain cell detects charges from molecular species moving through the flow channel that are larger than approximately 10 nanometers in size.

* * * * *